(12) United States Patent
Goodell

(10) Patent No.: US 6,259,303 B1
(45) Date of Patent: Jul. 10, 2001

(54) WAVE SHAPING CIRCUIT

(75) Inventor: Trenor F. Goodell, Peaks Island, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/440,783

(22) Filed: Nov. 16, 1999

(51) Int. Cl.[7] .................................................. H03K 17/16
(52) U.S. Cl. ............................. 327/391; 327/112; 326/27
(58) Field of Search ................................... 327/110, 111, 327/112, 165, 132, 276, 277, 278, 281, 284, 288, 391; 326/26, 27

(56) References Cited

U.S. PATENT DOCUMENTS

| | | |
|---|---|---|
| 5,013,932 | 5/1991 | Smith . |
| 5,039,875 | 8/1991 | Chang . |
| 5,107,149 * | 4/1992 | Platt et al. ............................. 327/357 |
| 5,151,620 | 9/1992 | Lin . |
| 5,357,145 | 10/1994 | Segaram . |
| 5,369,354 * | 11/1994 | Mori ..................................... 323/313 |
| 5,459,424 | 10/1995 | Hattori . |
| 5,491,456 * | 2/1996 | Kay et al. ............................... 331/57 |
| 5,656,960 | 8/1997 | Holzer . |
| 5,703,519 | 12/1997 | Crook et al. . |
| 5,793,222 | 8/1998 | Nakase . |

FOREIGN PATENT DOCUMENTS

| | | | |
|---|---|---|---|
| 62-2290208 * | 12/1987 | (JP) ...................................... | 327/389 |
| 10242827 * | 9/1998 | (JP) . | |

\* cited by examiner

*Primary Examiner*—Terry D. Cunningham
*Assistant Examiner*—Quan Tra
(74) *Attorney, Agent, or Firm*—Pierce Atwood; Chris A. Caseiro

(57) ABSTRACT

A wave shaping circuit for shaping the transition edges of switching electrical signals. The wave shaping circuit controls voltage output as a function of time and is applicable in digital and analog systems. The shaping circuit includes one or more stages having the capability to conduct current simultaneous during signal transitions. Each simultaneous conduction current stage is coupled to a current mirror circuit powered by a power supply rail. The current mirror circuit is coupled to a capacitive element that is charged or discharged by current provided through the simultaneous conduction current stage or stages. Through selectable design of the simultaneous conduction stages, the current mirror circuit, and the capacitive element, the designer can tailor the shape of the transition curve as the input signal is propagated through the shaping circuit to the output.

19 Claims, 5 Drawing Sheets

WAVE SHAPING CIRCUIT

BACKGROUND OF THE INVENTION

1. Field of the Invention

The present invention relates to circuitry for controlling voltage as a function of time. In particular, the present invention relates to circuitry for regulating the voltage available at a certain point in time. This includes, but is not limited to, reducing noise (overshoot and undershoot) associated with the switching of electrical signals transmitted from one location to another. The present invention is a wave shaping circuit particularly useful with Complementary Metal Oxide Semiconductor (CMOS) circuits.

2. Description of the Prior Art

Electrical signal transmission circuits such as output buffers are used to transfer electrical signals of desired amplitude and strength. Signal transfers occur by way of interfaces, such as buses, that couple active devices that are either on the same semiconductor-based system or on different systems. The systems may be located proximate to one another, or they may be some distance from one another. One example of a proximate system interface requiring one or more bus connections is the coupling of one printed circuit board to another within a computing system, such as through a backplane bus. An example of a remote system interface requiring one or more bus connections is the coupling of one computing system to another, such as through a telephone transmission line that is, effectively, a voice/data bus. More generally, any system used to transfer electrical signals from one point to another, whether digital or analog, requires some arrangement for ensuring that the transfer occurs as smoothly as possible when desired.

As indicated, signal transmission circuits are used to ensure that electrical signals are transferred as accurately and as quickly as possible. It is often the case, however, that when transmission rates increase, signal accuracy suffers. In particular, it is well known that rapid signal transmission may be accompanied by signal bounce. That is, the noise or ringing associated with the undershoot and overshoot of a final steady state logic HIGH or logic LOW signal that occurs in the transition between those two logic levels. The difference in the potentials associated with a HIGH signal and a LOW signal may be as small as 0.4V or as great as 5V. For CMOS-based logic, for example, a logic HIGH corresponds to a nominal 5.0V potential (for a 5.0V power supply) and a nominal 3.3V potential (for a 3.3V power supply), while a logic LOW is essentially equivalent to ground (GND) or 0.0V.

The potentials associated with HIGH and LOW signals described above are idealized values. In fact, HIGHS and LOWS generally fall within a range of potentials associated with the indicated values. Thus, for a 3.3V supply, a HIGH signal may be supplied at 2.6V, for example, while a LOW signal may actually be associated with a 0.7V value. As the potentials of the power supplies used to power circuitry move closer to GND, the signal bounce mentioned above takes on greater importance. In particular, the initial oscillation around the ultimate steady state value that occurs when the transition between HIGH and LOW is triggered may vary enough to generate a false logic signal. The noise swing may be enough to cause a LOW signal to transition to a HIGH signal potential and vice-versa, or it may be variable enough that the signal is not clearly at either a HIGH or a LOW. Either situation is undesirable. For that reason, it is becoming increasingly important that the transitions between HIGH and LOW occur with less noise than has been previously experienced.

Clearly, unexpected changes in logic values are not desirable. This problem is more likely to occur as transmission rates are increased. Increasing transmission rates enables the transfer of more data in a shorter time period and so is desirable in many respects. However, the gain in increased transmission rate is often undermined by an increase in signal noise. That is, a rapid change in signal level creates an oscillation about the steady state value corresponding to the sudden switching on or off of a transistor. Variations in the loads coupled to the outputs of such circuits also affect noise characteristics. As transistors become increasingly smaller in order to achieve the faster transmission rates of interest, the signal bounce that occurs with the rapid switching often creates reflections in transmission media, such as telephone transmission lines where reflections will cause signal errors. It is therefore important to enable "gentle" switching of transmission circuits so that signal noise is reduced.

Moreover, in order to improve the compatibility of disparate computing systems, it is of importance to be able to regulate the rate at which signal transitions occur. In that regard, it would be of value to be able to control the rate at which a signal transition occurs. While this control may be regulated to a certain extent using delay stages, such as by employing chains of inverters, there remains uncertainty in the application of such arrangements in that the delay associated with such stages may vary unacceptably. Additionally, as computing systems become increasingly sophisticated, it is desirable to enable the designer to tailor the signal transition rate.

A simplified illustration of a prior-art CMOS-based signal transmission (buffer) circuit of the type that exhibits unacceptable signal bounce characteristics is presented in FIG. 1. The buffer circuit includes an input node input for receiving an electrical signal that triggers operation of the buffer, and an output node output for the transfer of that signal to downstream circuitry. The input node is coupled to an inverter IV1 formed of P-type MOS transistor M1 and N-type MOS transistor M2. The output of the inverter IV1 is connected to the control node of a second inverter IV2 formed of pull-up P-type MOS transistor M3 and pull-down N-type MOS transistor M4. Those skilled in the art will recognize that additional inverters can be used between inverters IV1 and IV2 as delay stages.

As in any CMOS logic circuit, one and only one of transistors M3 and M4 is supposed to be turned on at a given time. When transistor M3 is on, the gate-source voltage (Vgs) exceeds the transistor's threshold voltage (Vt). The output node is at a logic high potential equivalent to high-potential power rail Vcc less the drain-source voltage (Vds) drop associated with transistor M3. When transistor M4 is on, the output node is at a logic low potential equivalent to low-potential power rail GND. It can be seen that signal bounce at the control nodes of transistors M3 and M4 may create the situation where the wrong one may be on, they may be conducting simultaneously, or they may both be off. As indicated, in most instances, neither situation is desirable. Further, the prior art buffer of FIG. 1 offers little control over the signal transmission rate from input to output.

Therefore, what is needed is a signal transmission circuit that reduces the noise associated with signal switching. What is also needed is a signal transmission circuit that may be used to tailor the shape of the signal passing between the input and output nodes of the circuit. Further, what is needed is such a wave shaping signal transmission circuit that achieves the noted goals without complicated circuitry that takes up valuable layout space. In general terms, what is needed is a signal transmission circuit that permits a system designer to control voltage as a function of time, whether to smooth the signal, to set the transmission rate, or for any other purpose of interest, digital or analog.

SUMMARY OF THE INVENTION

It is an object of the present invention to provide a signal transmission circuit that reduces the noise associated with signal switching. It is also an object of the present invention to provide a signal transmission circuit that may be used to tailor the shape of the signal passing between the input and output nodes of the circuit. Further, it is an object of the present invention to provide a wave shaping transmission circuit that achieves the noted goals without complicated circuitry that takes up valuable layout space. In general terms, the present invention is a signal transmission circuit that permits a system designer to control voltage as a function of time, whether to smooth the signal, to set the transmission rate, or for any other purpose of interest, digital or analog.

These and other objects are achieved in the present invention, which is a wave shaping circuit that enables a designer to define precisely controlled signal transition edge characteristics. The wave shaping circuit of the present invention includes one or more inverter stages that are tapped for their simultaneous conduction current. That simultaneous conduction current is passed through a current mirror to a capacitance device. The current mirror is coupled to the power supply rail—the high-potential power supply rail to charge the capacitance device, and to the low-potential power supply rail to discharge the capacitance device. The capacitance device is charged or discharged by the simultaneous conduction current to produce a proportional potential. The proportional output potential of that capacitance device is the output of the signal transmission circuit of the present invention.

It is well known that simultaneous conduction occurs in an inverter during any transition between the two logic levels. There is no way to avoid this event and the present invention takes advantage of this normally occurring artifact. In an inverter stage that is CMOS based, for example, the simultaneous conduction occurs during signal transition when the P-type MOS (PMOS) and N-type MOS (NMOS) transistors that form the CMOS circuit are both on. Consequently, there is a direct current path from the high-potential node of the PMOS transistor and the low-potential node of the NMOS transistor. The current that passes through the simultaneously on transistors, and its duration, are dependent upon the characteristics of those transistors and the potential applied to the high-potential node of the PMOS transistor. (Or to the low-potential node of the NMOS transistor when the simultaneous conduction current is "negative.") This simultaneous conduction current is ordinarily an undesirable source of power consumption, but is desirable for the purpose of the present invention.

The present invention enables a circuit designer to take advantage of the simultaneous conduction current that passes transiently through a CMOS-based inverter stage. The designer may select the number and the characteristics of the inverter stage(s) of the signal transmission circuit. Those characteristics define the simultaneous conduction period for each inverter stage. When a plurality of inverter stages are placed in series and tapped for their simultaneous conduction current in turn, the resultant conduction pulses form the time base of a controlled wave form. It can be seen by those skilled in the art that this characteristic of the present invention may be used in a variety of ways in digital and analog transmissions.

The characteristics of the current mirror may also be selected to define the value of the current passing through the one or more inverter stages for the simultaneous conduction period. Finally, the capacitance C of the capacitance device CAP may be selected in order to define the output potential of the device.

That potential $V_{CAPn}$ is generated over time t by the simultaneous conduction associated with inverter stage n pursuant to Equation (1), in which $i_n$ is the simultaneous conduction current through inverter stage n.

$$V_{CAPn}(t)=(1/C)\int i_n dt \qquad \text{Eq. (1)}$$

Coupling a plurality of inverter stages to the current mirror path permits the designer to control the capacitance device's voltage at fixed points in time. That control includes the capability of varying the current drawn by each inverter stage, again, as a function of the inverter stage design and the current mirror characteristics.

The wave shaping circuit of the present invention includes one or more inverter stages, a capacitance device coupled to the circuit's output, and a current mirror circuit for each power supply rail. That combination enables a designer to shape the features of the signal edges based upon specific component selections. As a result, system compatibility can be enhanced and/or signal noise reduced. These and other advantages of the present invention will become apparent upon review of the detailed description, the accompanying drawings, and the appended claims.

DESCRIPTION OF THE PREFERRED EMBODIMENT OF THE INVENTION

Figure 1:
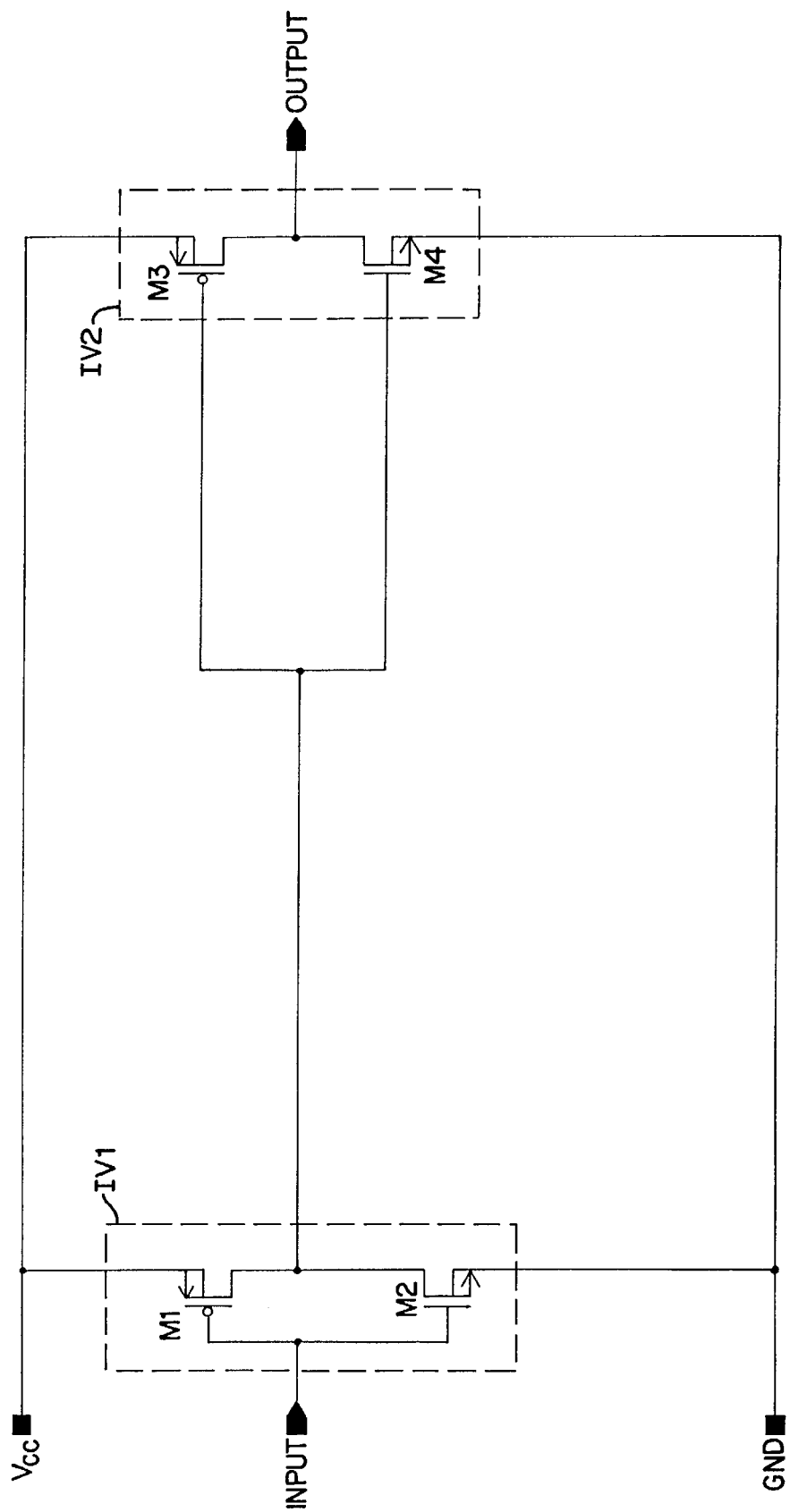
FIG. 1 is a simplified circuit diagram showing a generic prior-art signal transmission circuit.
Figure 2:
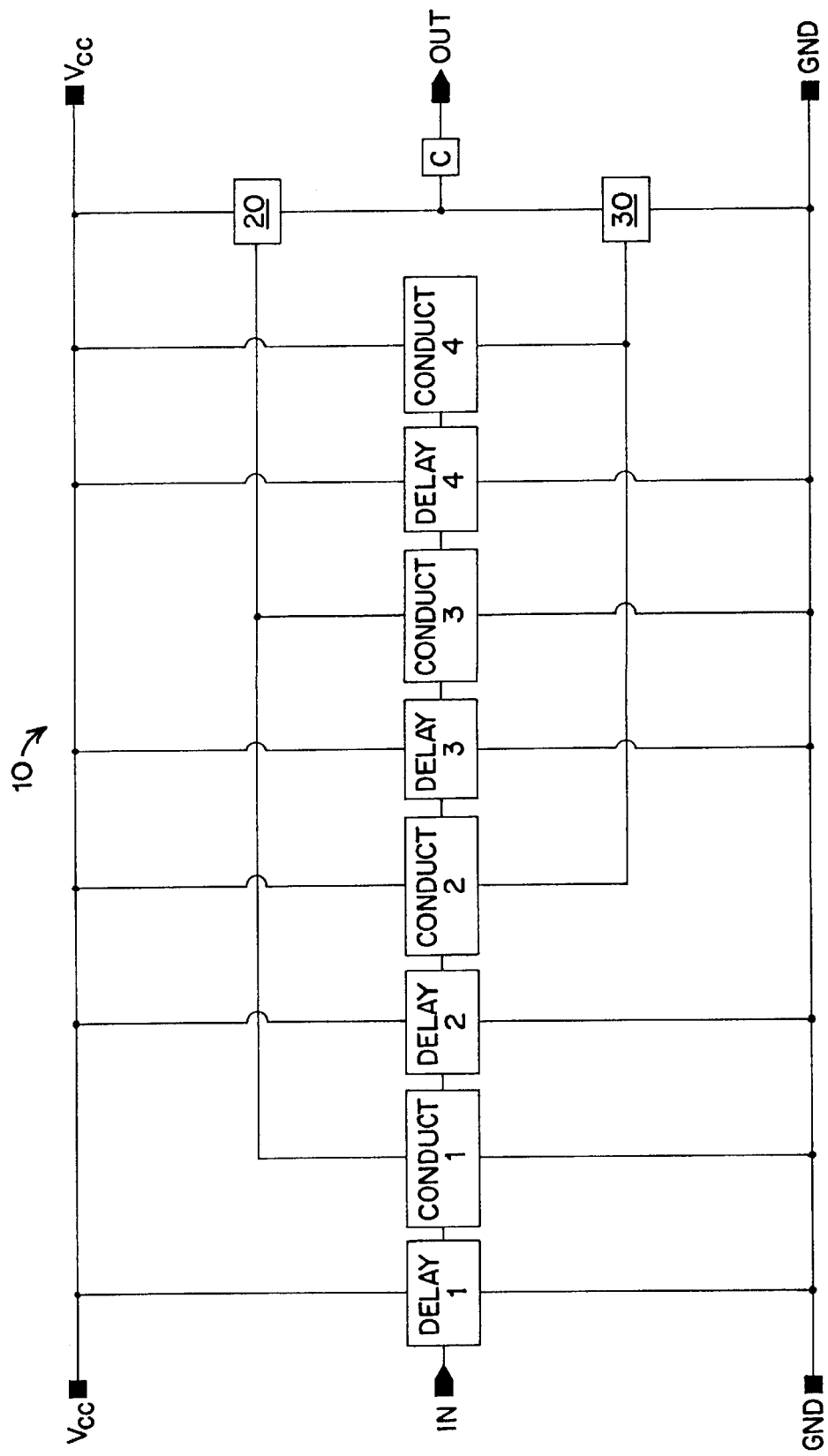
FIG. 2 is a simplified circuit diagram showing the wave shaping circuit of the present invention in block form.

A wave shaping circuit 10 of the present invention is shown in FIG. 2. The circuit 10 of the present invention includes one or more simultaneous conduction sub-circuits and may also include one or more delay stage sub-circuits. For purposes of illustration, the circuit 10 shown in FIG. 2 includes a first delay stage DELAY1, a first simultaneous charging conduction circuit CONDUCT1, a second delay stage DELAY2, a second simultaneous discharging conduction circuit CONDUCT2, a third delay stage DELAY3, a third simultaneous charging conduction circuit CONDUCT3, a fourth delay stage DELAY4, and a fourth simultaneous discharging conduction circuit CONDUCT4. It is to be understood that the various delay stages and conduction circuits presented herein may be different in number and coupling arrangements. It is important to note that the circuit 10 illustrated in FIG. 2 shows the options available for shaping the wave associated with the signal coming in at IN.

With continuing reference to FIG. 2, the delay stages are powered by high-potential power rail Vcc and low-potential power rail GND. They may be tailored to regulate the rate at which a switching signal coming in at IN is propagated through the circuit 10 including the downstream conduction circuits. Charging conduction circuits CONDUCT1 and CONDUCT3 are coupled to GND and to a first current mirror circuit 20. Discharging conduction circuits CONDUCT2 and CONDUCT4 are coupled to Vcc and to a second current mirror circuit 30. Current mirror circuit 20 has a high-potential node coupled to Vcc and current mirror circuit 30 has a low-potential node coupled to GND. The low-potential node of circuit 20 and the high-potential node of circuit 30 are coupled to capacitance device C such that circuit 20 acts to charge device C and circuit 30 acts to discharge device C. Circuit 20 charges as a function of the simultaneous conduction currents associated with circuits CONDUCT1 and CONDUCT3, and circuit 30 discharges as a function of the simultaneous conduction currents associated with circuits CONDUCT2 and CONDUCT4.

It is to be noted that each of the conduction circuits is designed to allow current to pass therethrough when a signal edge is experienced. Once the signal transition is complete, only the potential of Vcc or GND results at each conduction circuit's output. As shown in FIG. 2, when a signal edge or transition passes through the circuit 10, charging conduction circuit CONDUCT1 first passes current to establish a pathway via mirror circuit 20 between Vcc and charge device C. After the transition is complete, circuit CONDUCT1 no longer acts to charge device C. Instead, steady-state logic potentials are propagated to the next stage of the circuit 10. Conduction circuit CONDUCT3 acts in a similar manner only displaced by a period of time determined by the characteristics of the delay stages and conduction circuit CONDUCT2. When a signal transition is applied to its input node, discharging conduction circuit CONDUCT2 passes current to establish a pathway via mirror circuit 30 between GND and device C. The voltage of capacitance device C is established at fixed points in time as a function of the specific current drawn by each of the conduction circuits. As noted, the delay stages may be used to assist in establishing those times.

Figure 3:
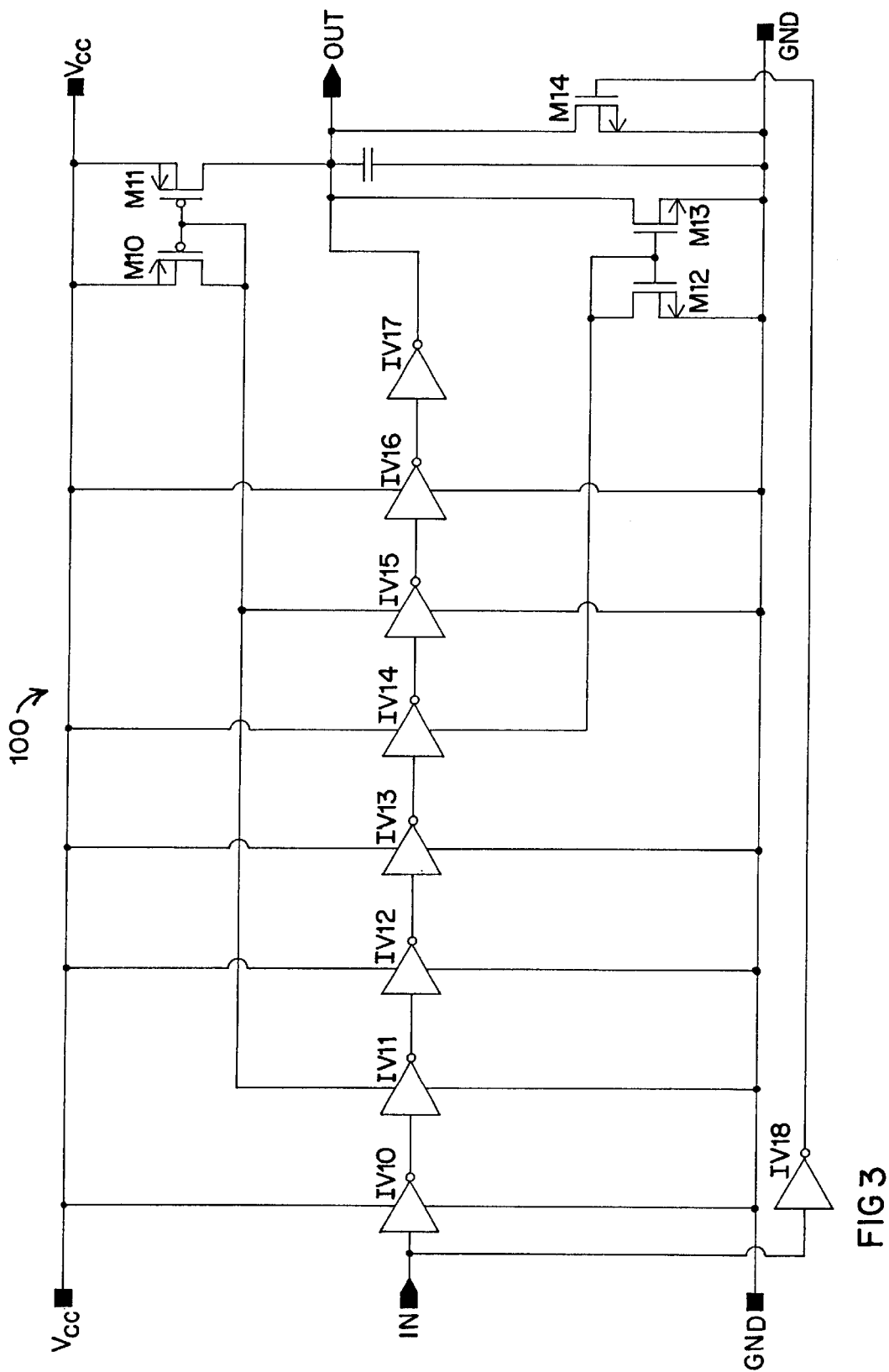
FIG. 3 is a simplified circuit diagram of a preferred embodiment of the wave shaping circuit of the present invention.

A preferred embodiment of the present invention is shown in FIG. 3. It is to be understood that this is one form of the wave shaping circuit of the type shown in FIG. 2. Alternative embodiments may be created by those skilled in the art. In FIG. 3, a wave shaping circuit 100 of the present invention includes a first delay stage inverter IV10 having its input coupled to triggering circuit input node IN. IV10 has a high-potential supply node coupled to Vcc and a low-potential supply node coupled to GND. The output of IV10 is coupled to the input of first conduction circuit inverter IV11 having a high-potential supply node coupled to charging current mirror circuit 200 and a low-potential node coupled to GND. The output of IV11 is coupled to the input of second delay stage inverter IV12, which has a high-potential node coupled to Vcc and a low-potential node coupled to GND. The output of IV12 is coupled to the input of third delay stage inverter IV13, which has a high-potential node coupled to Vcc and a low-potential node coupled to GND. The output of IV13 is coupled to the input of second conduction circuit inverter IV14 having a high-potential supply node coupled to Vcc and a low-potential node coupled to discharging current mirror circuit 300. The output of IV14 is coupled to third conduction circuit inverter IV15 having a high-potential supply node coupled to charging current mirror circuit 200 and a low-potential node coupled to GND. The output of IV15 is coupled to fourth delay stage inverter IV16, which has a high-potential node coupled to Vcc and a low-potential node coupled to GND. Finally, the output of IV16 is coupled to the input of fifth delay stage inverter IV17, which has an output coupled to the output node OUT of circuit 100, a high-potential node coupled to Vcc, and a low-potential node coupled to GND.

With continuing reference to FIG. 3, the mirror circuit 200 of circuit 100 includes a first PMOS transistor M10 and a second PMOS transistor M11. The sources and bulks of those two transistors are coupled to Vcc and their gates are coupled to the high-potential nodes of inverters IV11 and IV15. The drain of M10 is also coupled to the high-potential nodes of inverters IV11 and IV15. The current that passes from the drain of M10 to inverters IV11 and IV15 is mirrored to capacitor CAP via the drain of transistor M11, both of which are coupled to the output OUT of circuit 100. Similarly, the mirror circuit 300 of circuit 100 includes a first NMOS transistor M12 and a second NMOS transistor M13. The sources and bulks of those two transistors are coupled to GND and their gates are coupled to the low-potential node of inverter IV14. The drain of M12 is also coupled to the low-potential node of inverter IV14 such that mirror circuit 300 is always on. The current that passes from the drain of M12 to inverter IV14 is mirrored to capacitor CAP via the drain of transistor M13, both of which are coupled to the output OUT of circuit 100. The high-potential node of CAP is coupled to the drains of transistors M11 and M13, and its low-potential node is coupled to GND. Obviously, it can be seen that the capacitor CAP develops a time-based voltage that is referenced to the potential of GND.

Figure 3A:
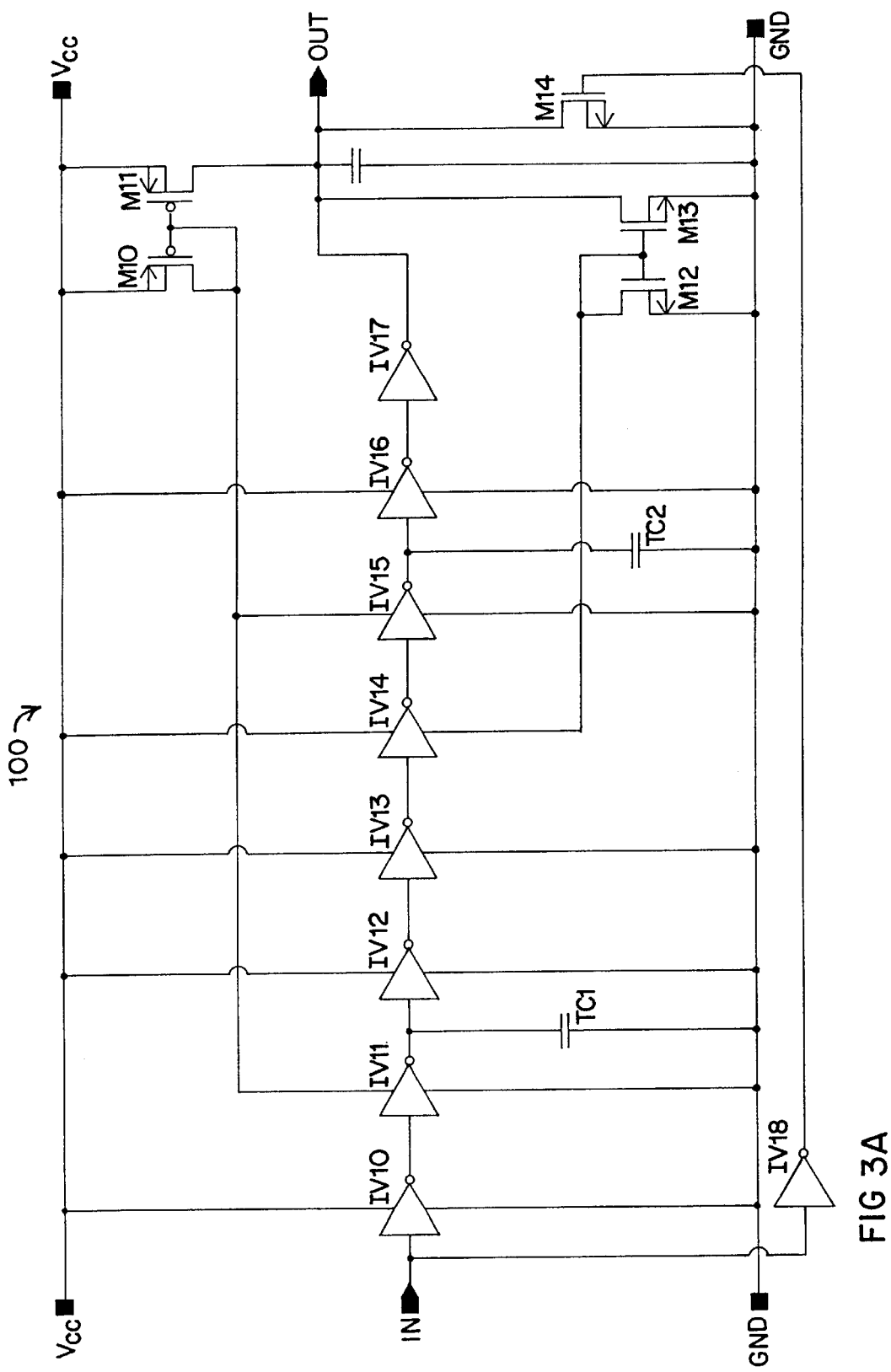
FIG. 3A is a simplified circuit diagram of an alternative embodiment of the wave shaping circuit of the present invention similar to the circuit illustrated in FIG. 3.

It is to be noted that inverter IV18 and NMOS transistor M14 may operate as a reset stage of the circuit 100 if desired. Also, a resistance may be coupled between the output of inverter IV17 and OUT as an impedance to smooth any hard signal transition edges. Further, as illustrated in FIG. 3A, tail capacitors TC1 and TC2 may be coupled to the outputs of inverters IV11 and IV15 if desired. It is to be noted that tail capacitors may be coupled to any one or more of the current-mirror-coupled inverter stages. The configuration shown in FIG. 3A is for illustrative purposes only and is not intended to be limiting. This arrangement enables the designer to enhance current flow through the current mirror 200. That is, the addition of a tail capacitor to the output of an inverter coupled to a current mirror modifies the I-V curve associated with the simultaneous conduction current of a particular stage, thereby modifying the voltage as a function of time for the capacitor CAP. Of course, such a tail capacitor could be coupled to inverter IV14 as well.

Figure 4:
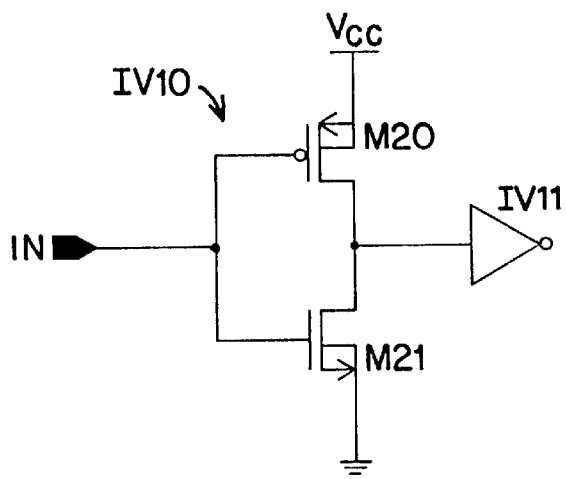
FIG. 4 is a simplified circuit diagram of a delay stage inverter of the present invention.

While the configurations of each of the inverters of FIGS. 3 and 3A, are selectable, it is important that they have simultaneous conduction characteristics. To that end, it is preferable that they be formed in fairly simple configurations as CMOS circuits. Specifically, as illustrated in FIG. 4, delay stage inverter IV11 may be a CMOS circuit including an input coupled to IN, an output coupled to the input of inverter IV11, and a complementary MOS pair of PMOS transistor M20 and NMOS transistor M21. The gates of M20 and M21 are coupled to IN and their drains are the output of the inverter. The source and bulk of M20 are coupled to Vcc and the source and bulk of M21 are coupled to GND.

Figure 5:
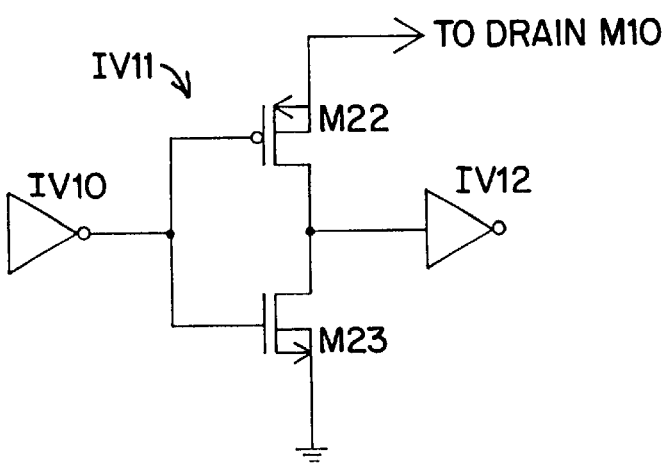
FIG. 5 is a simplified circuit diagram of a charging conduction inverter of the present invention.

FIG. 5 shows the preferred simplified embodiment of charging conduction inverter IV11. It is preferably formed as a CMOS circuit including an input coupled to the output of IV10, an output coupled to the input of inverter IV12, and a complementary MOS pair of PMOS transistor M22 and NMOS transistor M23. The gates of M22 and M23 are coupled to the output of IV10 and their drains are the output of the inverter. The source and bulk of M22 are coupled to the drain of current mirror transistor M10 and the source and bulk of M23 are coupled to GND.

Figure 6:
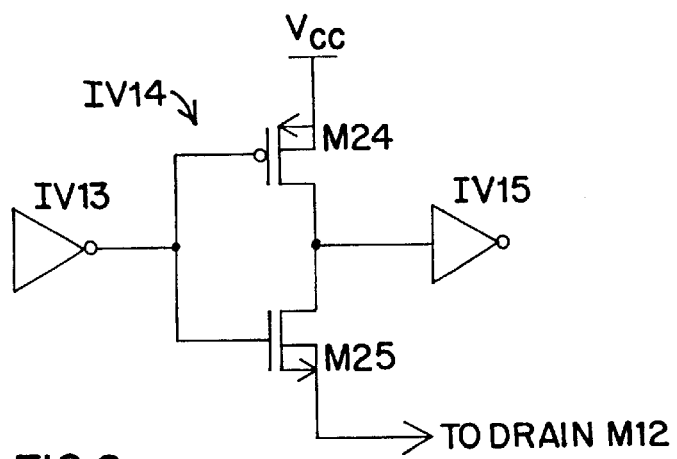
FIG. 6 is a simplified circuit diagram of a discharging conduction inverter of the present invention.

FIG. 6 shows the preferred simplified embodiment of discharging conduction inverter IV14. It is preferably formed as a CMOS circuit including an input coupled to the output of IV13, an output coupled to the input of inverter IV15, and a complementary MOS pair of PMOS transistor M24 and NMOS transistor M25. The gates of M24 and M25 are coupled to the output of IV13 and their drains are the output of the inverter. The source and bulk of M23 are coupled to Vcc and the source and bulk of M25 are coupled to the drain of current mirror transistor M12.

While the invention has been described with reference to particular example embodiments, it is intended to cover all modifications and equivalents within the scope of the following claims.

What is claimed is:

1. A wave shaping circuit for regulating the shape of a signal transition between an input node and an output node, the circuit comprising:
   a. one or more simultaneous conduction stages, wherein said one or more simultaneous conduction stages are coupled between the input node and the output node, and wherein each of said one or more simultaneous conduction stages has a first supply node coupled to either a high-potential power rail or to a low-potential power rail and each of said one or more simultaneous conduction stages has a second supply node;
   b. one or more current mirror circuits, wherein each of said one or more current mirror circuits has a power supply node coupled to either the high-potential power rail or the low-potential power rail, a current supply node coupled to one or more of said one or more simultaneous conduction stages at said second supply node, and an output coupled to the output node; and
   c. a capacitance device coupled to the output node.

2. The circuit as claimed in claim 1 further comprising one or more delay stages coupled between the input node and said one or more simultaneous conduction stages.

3. The circuit as claimed in claim 2 further comprising one or more delay stages between said one or more simultaneous conduction stages and the output node.

4. The circuit as claimed in claim 3 wherein each of said one or more simultaneous conduction stages is an inverter.

5. The circuit as claimed in claim 4 wherein each of said inverters is a CMOS circuit including a PMOS transistor and an NMOS transistor.

6. The circuit as claimed in claim 1 wherein said capacitance device is a capacitor.

7. The circuit as claimed in claim 1 wherein each of said simultaneous conduction stages includes an output, and wherein at least one of said one or more simultaneous conduction stages includes a tail capacitor coupled to said output thereof.

8. A wave shaping circuit for regulating the shape of a signal transition between an input node and an output node, the circuit comprising:
   a. a first simultaneous conduction stage having an input coupled to the input node, and an output, wherein said first simultaneous conduction stage has a first supply node coupled to a low-potential power rail and wherein said first simultaneous conduction stage has a second supply node;
   b. a second simultaneous conduction stage having an input coupled to the output of the first simultaneous conduction stage and an output coupled to the output node, wherein said second simultaneous conduction stage has a first supply node coupled to a high-potential power rail and wherein said first simultaneous conduction stage has a second supply node;
   c. a first current mirror circuit having a high-potential node coupled to the high-potential power rail and an input coupled to said second supply node of said first simultaneous conduction stage, and wherein said first current mirror circuit has an output;
   d. a second current mirror circuit having a low-potential node coupled to the low-potential power rail and an input coupled to said second supply node of said second simultaneous conduction stage, and wherein said second current mirror circuit has an output; and
   e. a capacitance device coupled to said output of said first current mirror circuit and to said output of said second current mirror circuit.

9. The circuit as claimed in claim 8 further comprising one or more delay stages coupled between the input node and said first simultaneous conduction stage.

10. The circuit as claimed in claim 9 further comprising one or more delay stages between said second simultaneous conduction stage and the output node.

11. The circuit as claimed in claim 8 wherein said first simultaneous conduction stage and said second simultaneous conduction stage is each an inverter.

12. The circuit as claimed in claim 11 wherein each of said inverters is a CMOS circuit including a PMOS transistor and an NMOS transistor.

13. The circuit as claimed in claim 12 wherein said PMOS transistor of said first simultaneous conduction stage includes a source coupled to said input of said first current mirror circuit.

14. The circuit as claimed in claim 13 wherein said NMOS transistor of said second simultaneous conduction stage includes a source coupled to said input of said second current mirror circuit.

15. The circuit as claimed in claim 13 wherein said first current mirror circuit includes a first PMOS transistor and a second PMOS transistor, wherein sources of said first and second PMOS transistors are coupled to the high-potential power rail, wherein gates of said first and second PMOS transistors are coupled to source of said PMOS transistor of said first simultaneous conduction stage, wherein a drain of said first PMOS transistor is coupled to said source of said PMOS transistor of said first simultaneous conduction stage, and a drain of said second PMOS transistor is coupled to said capacitance device.

16. The circuit as claimed in claim 14 wherein said second current mirror circuit includes a first NMOS transistor and a second NMOS transistor, wherein sources of said first and second NMOS transistors are coupled to the low-potential power rail, wherein gates of said first and second NMOS transistors are coupled to source of said NMOS transistor of said second simultaneous conduction stage, wherein a drain of said first NMOS transistor is coupled to said source of said NMOS transistor of said first simultaneous conduction stage, and a drain of said second NMOS transistor is coupled to said capacitance device.

17. The circuit as claimed in claim 8 wherein said capacitance device is a capacitor.

18. The circuit as claimed in claim 8 further comprising a tail capacitor coupled to said output of said first simultaneous conduction stage.

19. The circuit as claimed in claim 18 further comprising a second tail capacitor coupled to said output of said second simultaneous conduction stage.

* * * * *